(12) United States Patent
Cho et al.

(10) Patent No.: US 10,979,007 B2
(45) Date of Patent: Apr. 13, 2021

(54) AMPLIFICATION DEVICE WITH ISOLATION CHARACTERISTICS

(71) Applicant: SAMSUNG ELECTRO-MECHANICS CO., LTD., Suwon-si (KR)

(72) Inventors: Hyung Jun Cho, Suwon-si (KR); Hyun Jin Yoo, Suwon-si (KR); Jong Mo Lim, Suwon-si (KR); Hyun Hwan Yoo, Suwon-si (KR); Yoo Sam Na, Suwon-si (KR); Yoo Hwan Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/282,391

(22) Filed: Feb. 22, 2019

(65) Prior Publication Data
US 2020/0059210 A1 Feb. 20, 2020

(30) Foreign Application Priority Data
Aug. 17, 2018 (KR) .......................... 10-2018-0096013

(51) Int. Cl.
| | |
|---|---|
| H03F 1/12 | (2006.01) |
| H03F 3/24 | (2006.01) |
| H03F 1/56 | (2006.01) |
| H03F 1/02 | (2006.01) |
| H03F 3/19 | (2006.01) |

(52) U.S. Cl.
CPC ........... *H03F 3/245* (2013.01); *H03F 1/0205* (2013.01); *H03F 1/565* (2013.01); *H03F 3/19* (2013.01)

(58) Field of Classification Search
CPC ................................... H03F 1/12; H03F 3/191
USPC .................................................... 330/51, 302
See application file for complete search history.

(56) References Cited

U.S. PATENT DOCUMENTS

| | | | | |
|---|---|---|---|---|
| 6,522,195 B2* | 2/2003 | Watanabe | ............. | H03F 3/1935 330/151 |
| 6,667,657 B2* | 12/2003 | Nakatani | .................. | H03F 3/72 330/286 |

(Continued)

FOREIGN PATENT DOCUMENTS

| | | |
|---|---|---|
| JP | 2010-213141 A | 9/2010 |
| KR | 10-2000-0039219 A | 7/2000 |

(Continued)

OTHER PUBLICATIONS

Korean Office Action dated Aug. 18, 2019 in correspondiing Korean Patent Application No. 10-2018-0096013 (7 pages in English, 6 pages in Korean).

(Continued)

*Primary Examiner* — Henry Choe
(74) *Attorney, Agent, or Firm* — NSIP Law

(57) ABSTRACT

An amplifying device includes: an amplifying circuit connected between an input terminal and an output terminal and amplifying a signal input in an amplification mode; and a bypass circuit including a filter connected to a bypass path for bypassing the amplifying circuit, wherein the bypass path is in an off-state in the amplification mode and is in an on-state in a bypass mode, and the filter bypasses an input high-frequency signal to ground, in the amplification mode.

12 Claims, 8 Drawing Sheets

(56) References Cited

U.S. PATENT DOCUMENTS

| | | | |
|---|---|---|---|
| 6,999,740 B2* | 2/2006 | Ogihara | H03F 1/226 |
| | | | 330/151 |
| 8,149,049 B2* | 4/2012 | Takeuchi | H03F 1/22 |
| | | | 330/302 |
| 9,479,126 B2 | 10/2016 | Ilkov et al. | |
| 2002/0070809 A1 | 6/2002 | Watanabe et al. | |
| 2003/0193368 A1* | 10/2003 | Jackson | H03F 1/52 |
| | | | 330/51 |
| 2013/0113561 A1 | 5/2013 | Horiguchi et al. | |
| 2018/0048345 A1 | 2/2018 | Pehlke et al. | |

FOREIGN PATENT DOCUMENTS

| | | |
|---|---|---|
| KR | 10-2003-0070940 A | 9/2003 |
| KR | 10-0789918 B1 | 1/2008 |
| KR | 10-1460459 B1 | 11/2014 |
| KR | 10-2015-0122126 A | 10/2015 |
| WO | WO 2014/137776 A1 | 9/2014 |

OTHER PUBLICATIONS

Korean Office Action dated Apr. 3, 2020 in corresponding Korean Patent Application No. 10-2018-0096013 (6 pages in English, 5 pages in Korean).

* cited by examiner

AMPLIFICATION MODE

AMPLIFICATION DEVICE WITH ISOLATION CHARACTERISTICS

CROSS-REFERENCE TO RELATED APPLICATION

This application claims the benefit under 35 U.S.C. § 119(a) of Korean Patent Application No. 10-2018-0096013 filed on Aug. 17, 2018 in the Korean Intellectual Property Office, the entire disclosure of which is incorporated herein by reference for all purposes.

BACKGROUND

1. Field

The present disclosure relates to an amplification device with isolation characteristics.

2. Description of Related Art

Typically, a power amplifier (PA), a low noise amplifier (LNA), or similar amplifiers are included in wireless communication systems in order to transmit and receive a very large amount of data using 4G communications and to achieve very high output power and efficiency, and high sensitivity.

In particular, an LNA may receive a very low signal up to a high signal through an antenna, and in this regard, an LNA with various gains may be implemented to satisfy maximum performance using a signal at an appropriate level.

According to such a need, an LNA typically includes various gain modes between 20 dB and −10 dB, which include an amplification mode (=high gain mode) in which a signal is amplified through an LNA, and a bypass mode (=low gain mode) in which an input terminal (Input) and an output terminal (Output) are connected to a switch, but not through an LNA.

An LNA is broadly classified as a high gain mode and a low gain mode (a low gain mode or a bypass mode), and typically, a noise figure is important in the high gain mode and linearity is an important performance index in the low gain mode.

However, there is a problem in that isolation characteristics between the input and output terminals of an LNA in a low gain mode are degraded as a frequency band of a signal to be processed by a typical LNA is increased.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an amplifying device includes an amplifying circuit connected between an input terminal and an output terminal, and configured to amplify a signal input in an amplification mode; and a bypass circuit including a filter connected to a bypass path of the bypass circuit for bypassing the amplifying circuit, wherein the bypass path is configured to operate in an off-state in the amplification mode, and is configured to operate in an on-state in a bypass mode, and the filter is configured to bypass an input high-frequency signal to ground during the operation in the amplification mode.

The filter may include a low pass filter configured to bypass the input high-frequency signal to ground, in the amplification mode.

The bypass circuit may include at least one of a first switch connected between a first connection node on an input side of the amplifying circuit and the filter, and a second switch connected between a second connection node on an output side of the amplifying circuit and the filter.

The filter may include a first capacitor connected between the bypass path and the ground.

The filter may include at least one of a first resistor connected on a first side of a connection node that connects the bypass path and the first capacitor, and a second resistor connected on a second side of the connection node that connects the bypass path and the first capacitor.

The amplifying device may further include an input matching circuit connected between the input terminal and the first connection node and configured to perform impedance matching between the input terminal and the amplifying circuit.

The amplifying device may further include an output matching circuit connected between the second connection node and the output terminal, performing and configured to perform impedance matching between the amplifying circuit and the output terminal, and to further configured to adjust an amplifying gain and a return loss of the amplifying circuit.

In a general aspect, an amplifying device includes an amplifying circuit connected between an input terminal and an output terminal, and configured to amplify a signal input in an amplification mode, an input matching circuit connected between the input terminal and the amplifying circuit and configured to perform impedance matching between the input terminal and the amplifying circuit, an output matching circuit connected between the amplifying circuit and the output terminal and configured to perform impedance matching between the amplifying circuit and the output terminal, and a bypass circuit comprising a bypass path to bypass the amplifying circuit, wherein the bypass path is configured to operate in an off-state in the amplification mode, and is configured to operate in an on-state in a bypass mode, and an input high-frequency signal is bypassed to ground in the amplification mode.

The bypass circuit may include a filter which is connected to the bypass path for bypassing the amplifying circuit; and the filter may include a low pass filter configured to bypass the input high-frequency signal to ground, in the amplification mode.

The bypass circuit may include at least one of a first switch connected between a first connection node on an input side of the amplifying circuit and the filter, and a second switch connected between a second connection node on an output side of the amplifying circuit and the filter.

The filter may include a first capacitor connected between the bypass path and ground.

The filter may include at least one of a first resistor connected on a first side of a connection node which connects the bypass path and the first capacitor, and a second resistor connected on a second side of the connection node which connects the bypass path and the capacitor.

The input matching circuit may include an input inductor connected between the input terminal and the first connection node and configured to perform impedance matching between the input terminal and the amplifying circuit, and a variable attenuation circuit connected in series to the input inductor and configured to adjust a signal damping ratio in conjunction with an amplification ratio of the amplifying circuit.

The output matching circuit may include an output inductor connected between a terminal of a power voltage and the second connection node at the output side of the amplifying circuit, a variable resistor circuit connected in parallel to the output inductor, a variable capacitor circuit connected between the second connection node and the output terminal, and an output capacitor connected between the output terminal and ground.

In another general aspect, an amplifying device includes an amplifying circuit connected between an input matching circuit and an output matching circuit, the amplifying circuit configured to amplify a signal input in an amplification mode, and a bypass circuit connected between the input matching circuit and the output matching circuit, the bypass circuit configured to bypass the amplifying circuit in a bypass mode, and bypass an input high-frequency signal to ground in the amplification mode.

The input matching circuit may be configured to perform impedance matching between an input terminal and the amplifying circuit.

The output matching circuit may be configured to perform impedance matching between the amplifying circuit and an output terminal.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
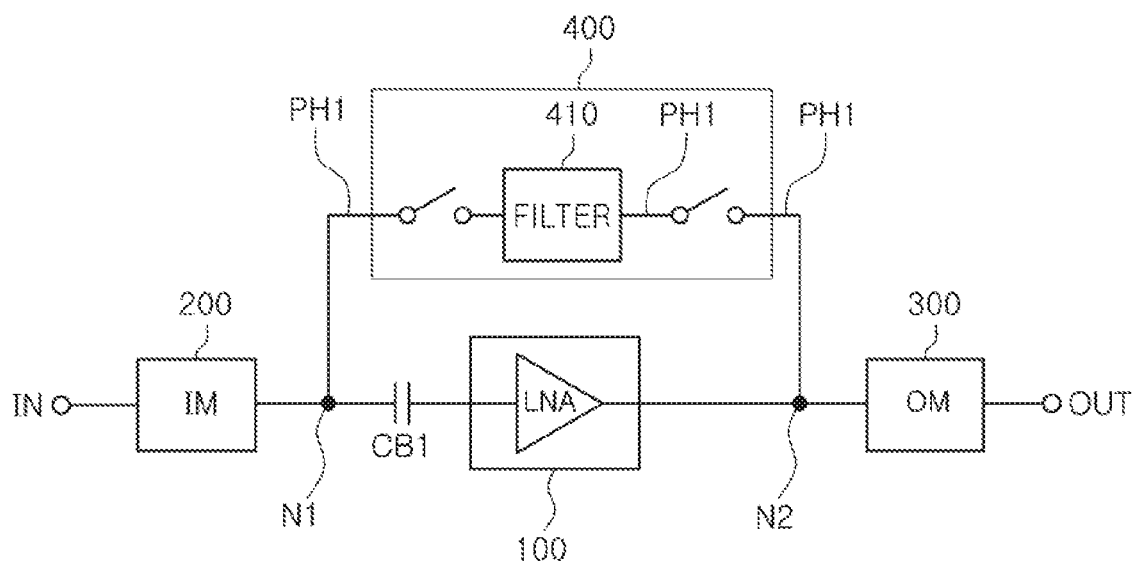
FIG. 1 is a diagram illustrating an example of an amplifying device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram showing an example of an amplifying device.

Referring to FIG. 1, the example amplifying device may include an amplifying circuit 100 and a bypass circuit 400.

The amplifying device may further include an input matching circuit 200 and an output matching circuit 300.

The amplifying circuit 100 may be connected between an input terminal IN and an output terminal OUT and may amplify a high-frequency signal input in an amplification mode.

The bypass circuit 400 may include a bypass path PH1 for bypassing the amplifying circuit 100. The bypass path PH1 may be turned off in the amplification mode, and may be turned on in a bypass mode. The bypass circuit 400 may bypass an input high-frequency signal to ground, in the amplification mode in which the bypass path PH1 is in an off-state.

For example, the bypass circuit 400 may further include a filter 410 connected to the bypass path PH1 for bypassing the amplifying circuit 100. As an example, the filter 410 may be a low pass filter for bypassing an input high-frequency signal to ground, in the amplification mode.

The input matching circuit 200 may be connected between the input terminal IN and the amplifying circuit 100 and may perform impedance matching between the input terminal IN and the amplifying circuit 100.

The output matching circuit 300 may be connected between the amplifying circuit 100 and the output terminal OUT and may perform impedance matching between the amplifying circuit 100 and the output terminal OUT. The output matching circuit 300 may adjust an amplifying gain and a return loss of the amplifying circuit 100.

In FIG. 1, CB1 is a direct current (DC) blocking capacitor for passing a high-frequency signal and blocking a DC component. The bypass path PH1 may be a path for bypassing the amplifying circuit 100 without passing through the amplifying circuit 100 between a first connection node N1 on an input side of the amplifying circuit 100 and a second connection node N2 on an output side of the amplifying circuit 100.

According to each example, the amplifying device may be a low noise amplifying device and the amplifying circuit 100 may be a low noise amplifying circuit (LNA), but the examples are not limited thereto.

In each drawing in the present disclosure, unnecessary repeated descriptions are omitted with respect to components with the same reference numeral and the same function, and only a difference between drawings will be described.

An example of the bypass circuit 400 will be described with reference to FIGS. 2 to 4.

Figure 2:
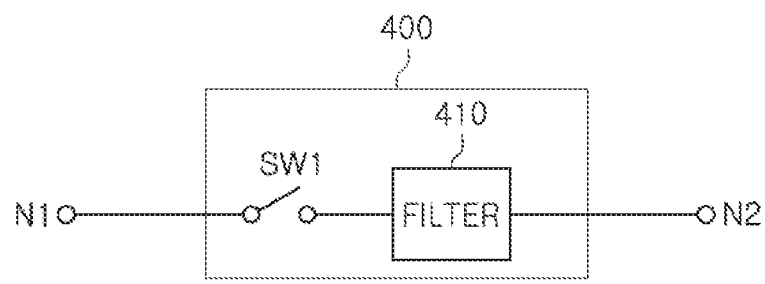
FIG. 2 is a diagram illustrating an example of a bypass circuit.

FIG. 2 is a diagram showing an example of a bypass circuit. FIG. 3 is a diagram showing another example of a bypass circuit. FIG. 4 is a diagram showing another example of a bypass circuit.

Referring to FIG. 2, the bypass circuit 400 may include a first switch SW1 connected between the first connection node N1 at the input side of the amplifying circuit 100 and the filter 410.

Figure 3:
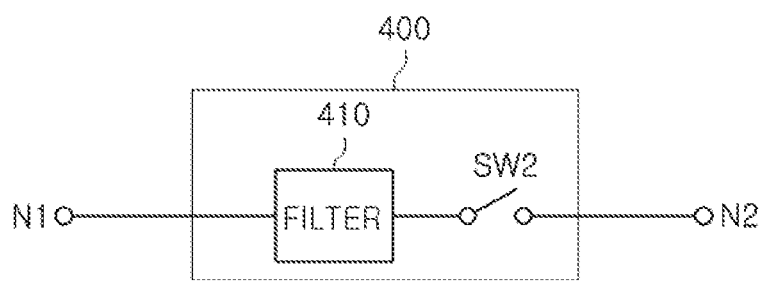
FIG. 3 is a diagram illustrating an example of a bypass circuit.

Referring to FIG. 3, the bypass circuit 400 may include a second switch SW2 connected between the second connection node N2 at the output side of the amplifying circuit 100 and the filter 410.

Figure 4:
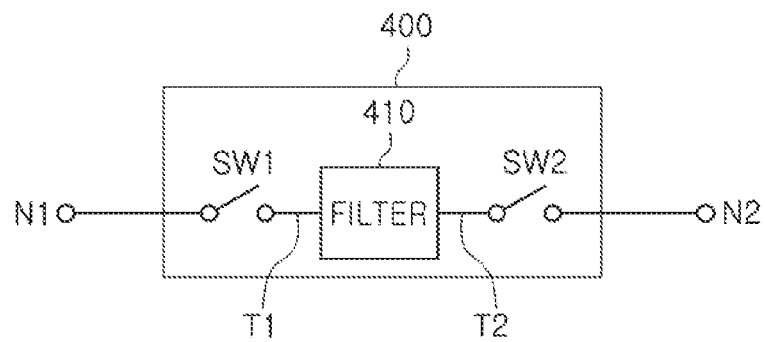
FIG. 4 is a diagram illustrating an example of a bypass circuit.

Referring to FIG. 4, the bypass circuit 400 may include the first switch SW1 connected between the first connection node N1 on an input side of the amplifying circuit 100 and the filter 410, and the second switch SW2 connected between the second connection node N2 on an output side of the amplifying circuit 100 and the filter 410.

For example, the first switch SW1 and the second switch SW2 may be a semiconductor switch device such as a metal-oxide semiconductor (MOS) transistor or a bipolar junction transistor (BJT).

In FIGS. 4, T1 and T2 are respectively a first terminal and a second terminal of the filter 410.

Figure 5:
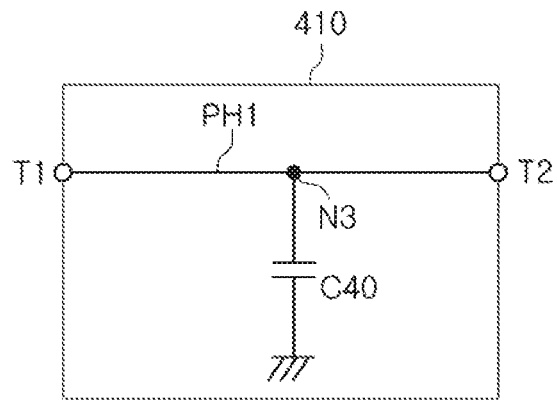
FIG. 5 is a diagram illustrating an example of a filter.
Figure 6:
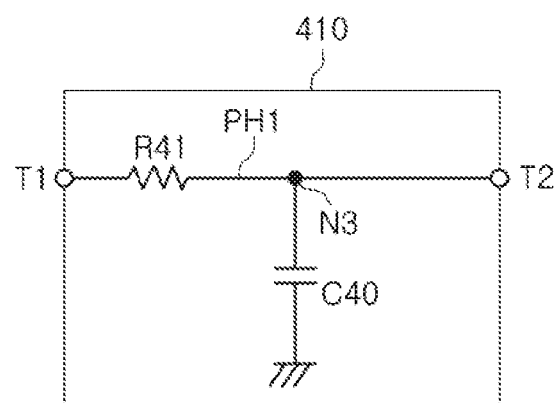
FIG. 6 is a diagram illustrating an example of a filter.
Figure 7:
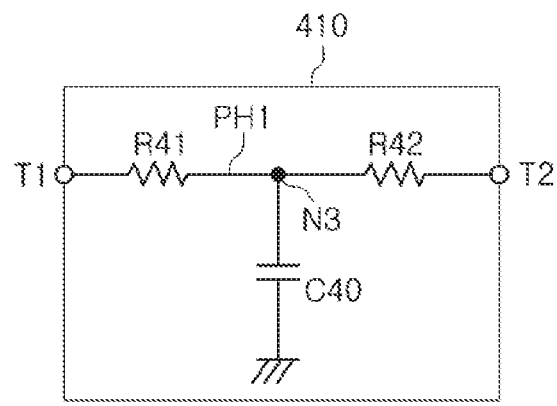
FIG. 7 is a diagram illustrating an example of a filter.

FIG. 5 is a diagram showing an example of a filter. FIG. 6 is a diagram showing another example of a filter. FIG. 7 is a diagram showing another example of a filter.

Referring to FIG. 5, the filter 410 may include a first capacitor C40 connected between ground and the bypass path PH1 between the first terminal T1 and the second terminal T2 that are opposite terminals.

Referring to FIG. 6, the filter 410 may include a first resistor R41 connected between the first terminal T1 and a connection node N3 with the first capacitor C40 and the bypass path PH1 connected thereto.

Referring to FIG. 7, the filter 410 may include the first resistor R41 connected between the connection node N3 with the first capacitor C40 and the bypass path PH1 connected thereto, and a second resistor R42 connected between the connection node N3 and the second terminal T2.

By the first capacitor C40, the input and output return loss characteristics of the bypass circuit 400 may be enhanced in a bypass mode and the isolation characteristics of the bypass circuit 400 may be enhanced in an amplification mode, which will be described with reference to FIGS. 11 and 12.

For example, a value CV1 of the first capacitor C40 may be greater than an off-capacitor value (Coff1 or Coff2) in an off-state of the first switch SW1 or the second switch SW2, for example, the value CV1 of the first capacitor C40 may be 80 to 100 femto-farad (fF) and the off-capacitor value (Coff1 or Coff2) may be 20 femto-farad (fF).

Referring to FIGS. 6 and 7, when the filter 410 includes a resistor and a capacitor, the filter 410 may be an RC filter that is one of a low pass filter.

Figure 8:
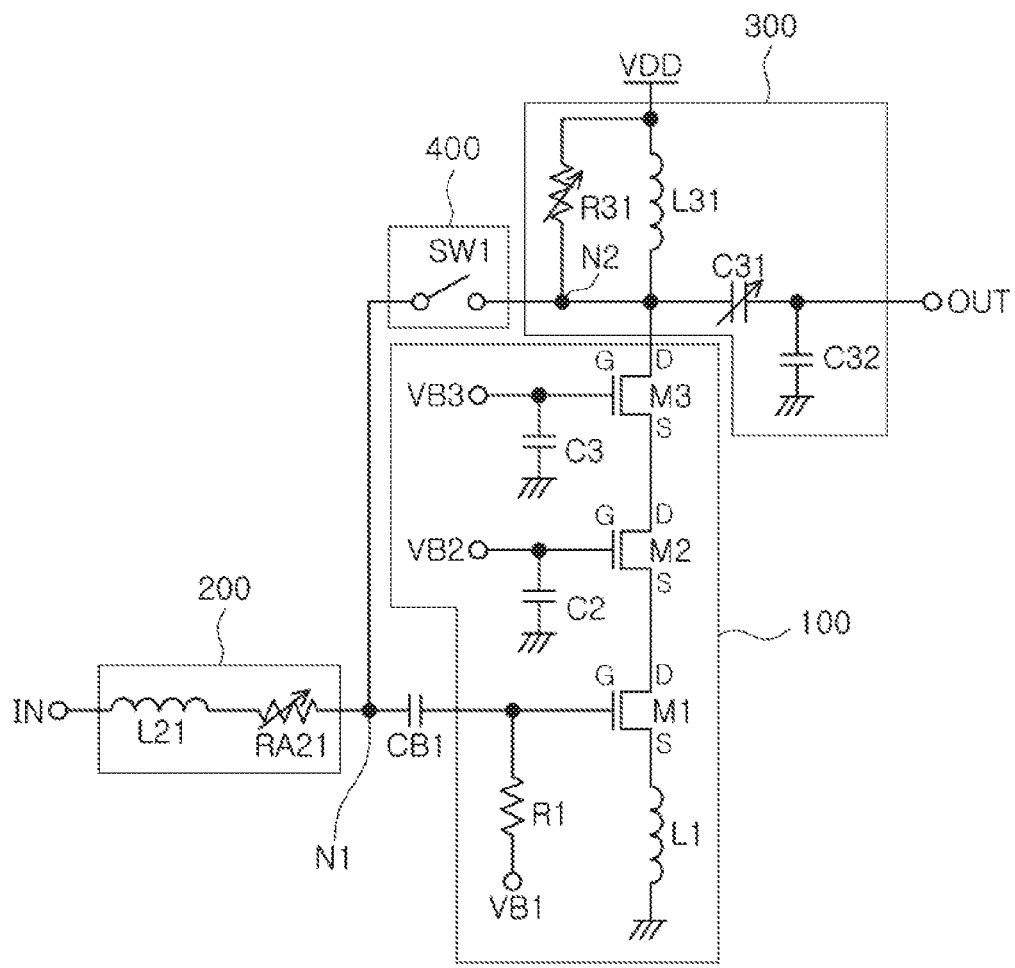
FIG. 8 is a circuit diagram illustrating an example of an amplifying device.

FIG. 8 is a circuit diagram showing an example of an amplifying device.

Referring to FIG. 8, for example, the amplifying circuit 100 may include a first transistor M1, a second transistor M2, and a third transistor M3, which are stacked between the first connection node N1 and the second connection node N2.

A gate of the first transistor M1 may be connected to the input matching circuit 200 through the DC blocking capacitor CB1 and may be connected to a terminal of a first bias voltage VB1 through a resistor R1. An inductor L1 may be connected between ground and a source of the first transistor M1. For example, the inductor L1 may be a degeneration inductor for enhancing linearity.

A gate of the second transistor M2 may be connected to a terminal of a second bias voltage VB2, and a capacitor C2 may be connected between ground and the gate of the second transistor M2. A source of the second transistor M2 may be connected to a drain of the first transistor M1, and a drain of the second transistor M2 may be connected to a source of the third transistor M3.

A gate of the third transistor M3 may be connected to a terminal of a third bias voltage VB3, and a capacitor C3 may be connected between ground and the gate of the third transistor M3. A source of the third transistor M3 may be connected to the drain of the second transistor M2, and a drain of the third transistor M3 may be connected to the second connection node N2.

As an example, an amplification ratio of the first transistor M1 may be equal to or greater than 1 and an amplification ratio of the second and third transistors M2 and M3 may be less than the amplification ratio of the first transistor M1.

For example, the input matching circuit 200 may include an input inductor L21 and a variable attenuation circuit RA21.

The input inductor L21 may be connected between the input terminal IN and the first connection node N1 and may perform impedance matching between the input terminal IN and the amplifying circuit 100.

The variable attenuation circuit RA21 may be connected in series to the input inductor L21 in response to a control signal that is not shown, and may adjust a signal damping ratio in conjunction with an amplification ratio of the amplifying circuit 100.

As an example, the output matching circuit 300 may include an output inductor L31, a variable resistor circuit R31, a variable capacitor circuit C31, and an output capacitor C32.

The output inductor L31 may be connected between a terminal of a power voltage VDD and the second connection node N2 on an output side of the amplifying circuit 100.

The variable resistor circuit R31 may be connected in parallel to the output inductor L31, and a resistance value of the variable resistor circuit R31 may be varied in response to the control signal, and may be involved in determining a gain of the amplifying circuit 100.

The variable capacitor circuit C31 may be connected between the second connection node N2 and the output terminal OUT, and a capacitor value of the variable capacitor circuit C31 may be varied in response to the control signal, and accordingly, a return loss of the variable capacitor circuit C31 may be adjusted.

The output capacitor C32 may be connected between the output terminal OUT and ground. For example, the output capacitor C32 may be involved in output matching.

Figure 9:
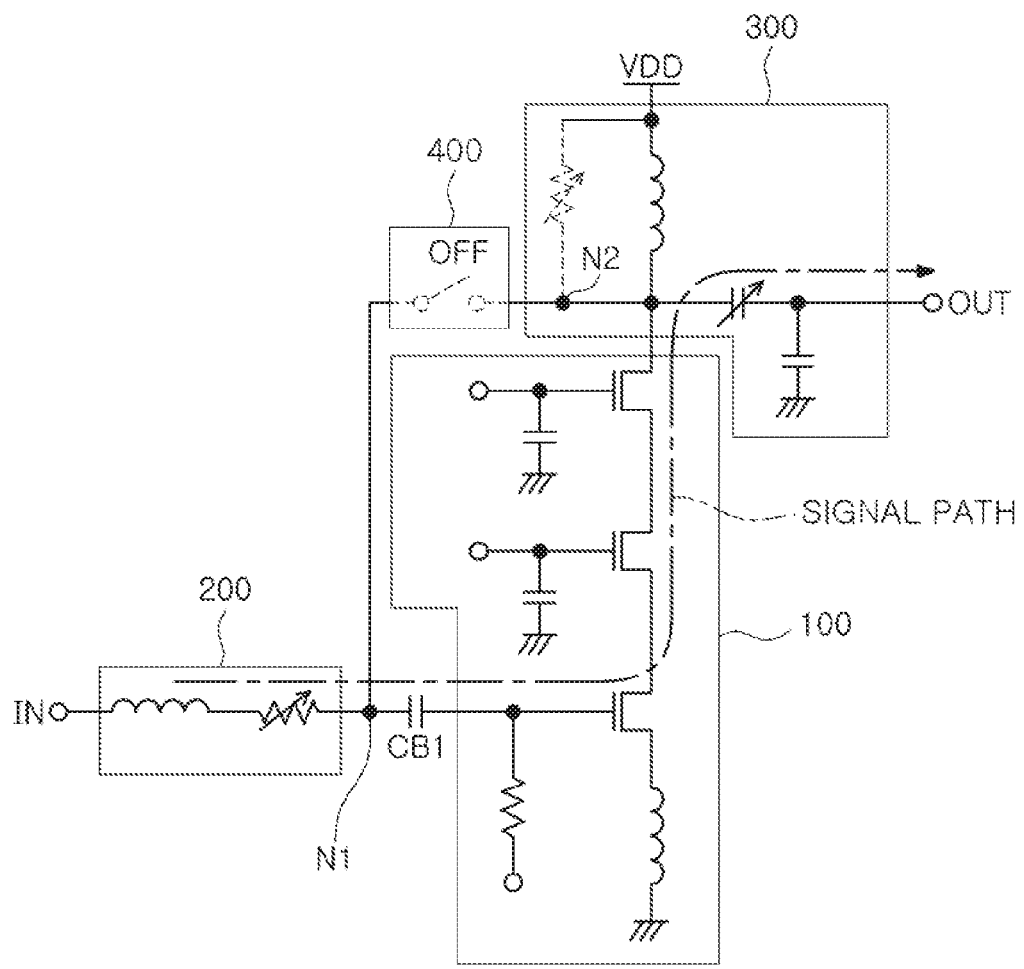
FIG. 9 is a diagram illustrating an example of an operation of the amplifying device of FIG. 8 in an amplification mode.

FIG. 9 is a diagram showing an example of an operation of the amplifying device of FIG. 8 in an amplification mode.

Referring to FIGS. 8 and 9, in an amplification mode (or high gain mode) of the amplifying device, an operation voltage VDD may be applied to the amplifying circuit 100, a bypass circuit 400 may be in an off-state, and the variable attenuation circuit RA21 of the input matching circuit 200 may also be in a state with a lowest signal damping ratio.

In this case, the variable resistor circuit R31 of the output matching circuit 300 may be adjusted to maintain high impedance, and thus, may not affect impedance of the output inductor L31. In the amplification mode (or high gain mode), the variable attenuation circuit RA21 of the input matching circuit 200 may also adjust a signal damping ratio and a resistance value of the variable resistor circuit R31 of the output matching circuit 300 to variably adjust a gain of the amplifying circuit 100.

Since the first, second, and third transistors M1, M2, and M3 are operated, current may be consumed and the bypass circuit 400 may be in an off-state, but an off capacitor of a transistor of the bypass circuit 400, in an off-state, connects input and output terminals of the amplifying circuit 100 to each other, and thus, isolation may be degraded, but the present disclosure may propose the aforementioned bypass circuit 400 for preventing isolation from being degraded, thereby enhancing isolation characteristics.

Figure 10:
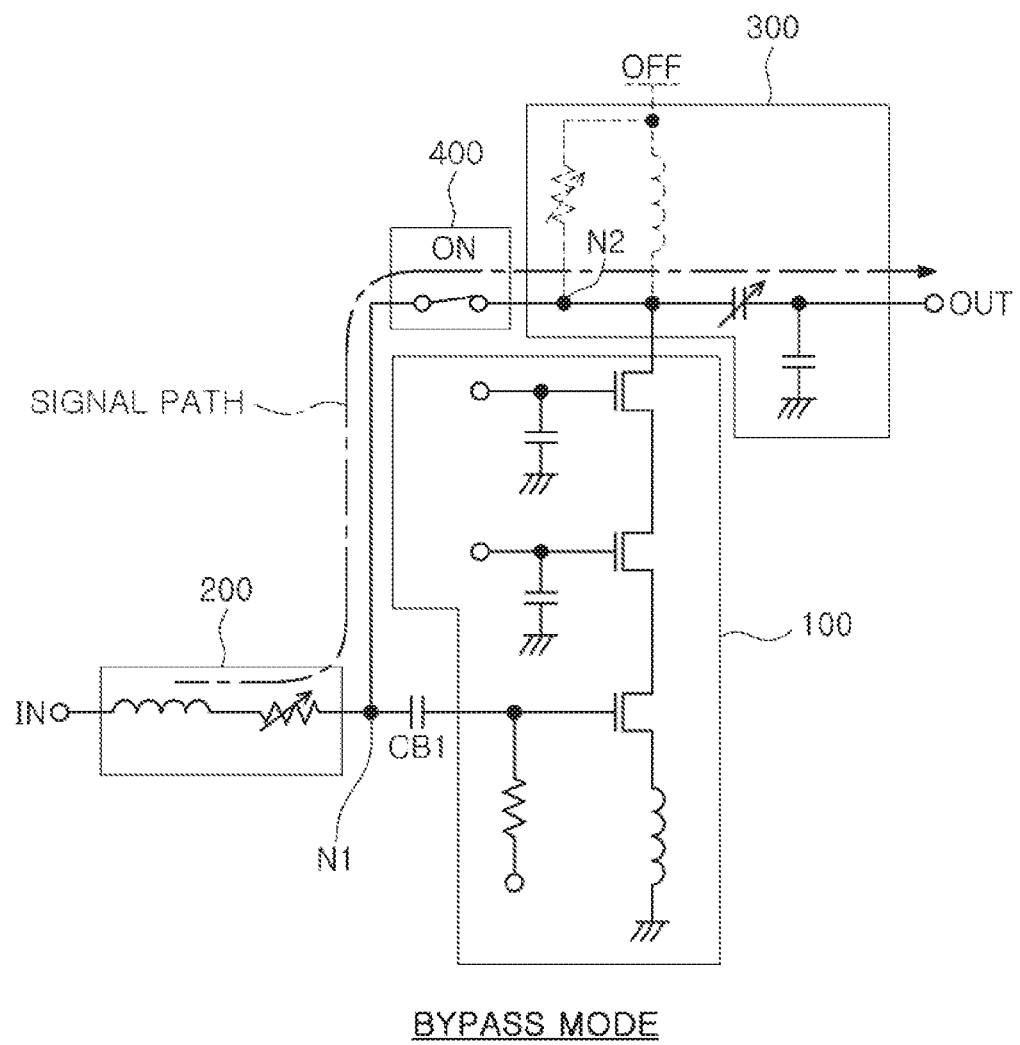
FIG. 10 is a diagram illustrating an example of an operation of the amplifying device of FIG. 8 in a bypass mode.

FIG. 10 is a diagram showing an example of an operation of the amplifying device of FIG. 8 in a bypass mode.

Referring to FIGS. 8 and 10, in the bypass mode (or low gain mode) of the amplifying device, the bypass circuit 400 is in an on-state, the operation voltage VDD is not applied to the bypass circuit 400, and thus, since the bypass circuit 400 may be in a ground state, the amplifying circuit 100 may not be operated. That is, all of the first, second, and third transistors M1, M2, and M3 are in an off-state, and thus, current may not flow therein, thereby saving power.

In this case, the input inductor L21 of the input matching circuit 200 and the output inductor L31 of the output matching circuit 300 may be operated as a matching device in the bypass mode, and thus, another separate matching device may not be required in the bypass mode.

Figure 11:
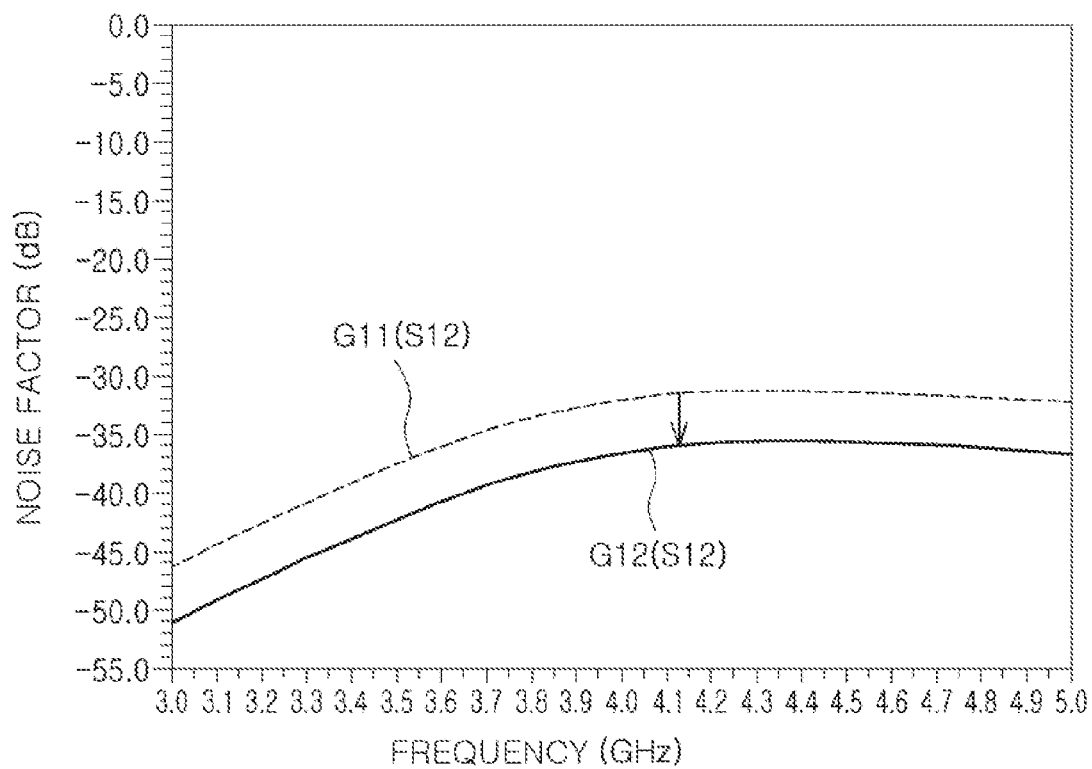
FIG. 11 is a graph of a noise figure (NF) in an amplification mode of an amplifying device according to an example.

FIG. 11 is a graph of a noise figure (NF) in an amplification mode of an amplifying device according to an example.

In FIG. 11, G11 is a plot of a noise figure (NF) in an amplification mode of a typical amplifying circuit, and G12 is a plot of a noise figure (NF) in an amplification mode of an amplifying circuit according to an example.

With reference to the noise figure (NF) based on G11 and G12 of FIG. 11, it may be seen that isolation is enhanced by about 5 dB compared with the typical amplification devices in a use frequency band (Band=3.8 to 4.4 GHz).

Figure 12:
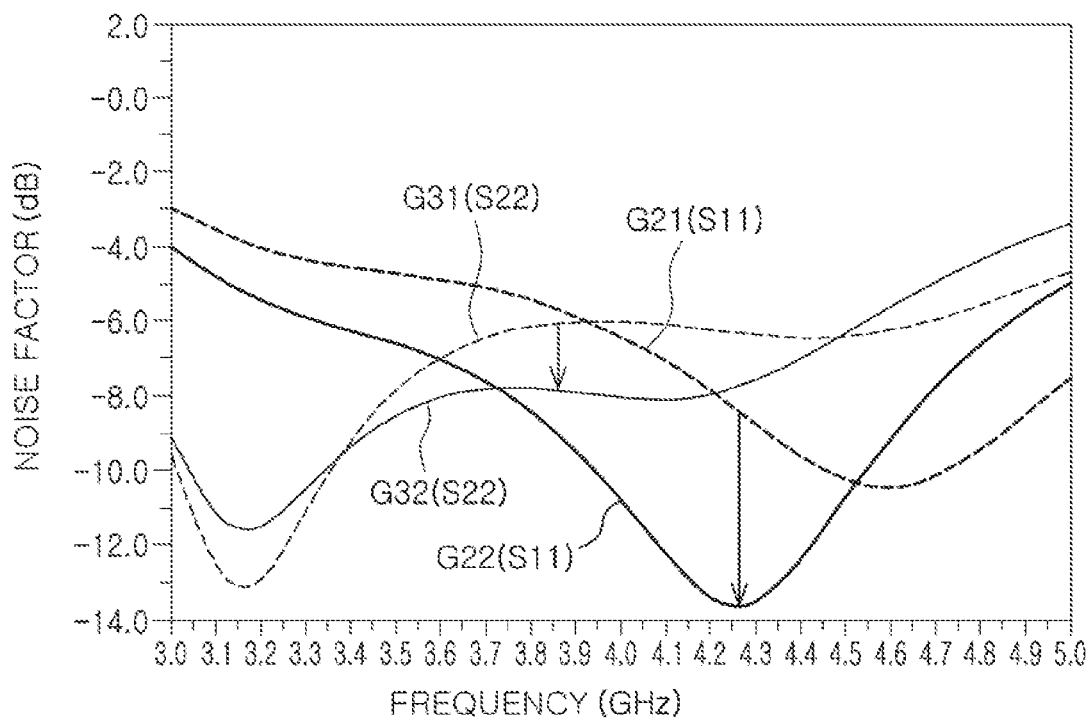
FIG. 12 is a graph of an input and output return loss in a bypass of an amplifying device according to an example.

FIG. 12 is a graph of an input and output return loss in a bypass of an amplifying device according to an example.

In FIG. 12, G21 is a plot of an input return loss in a bypass mode of a typical amplifying device, and G22 is a plot of an input return loss in a bypass mode of an amplifying device according to an example in the present disclosure. G31 is a plot of an output return loss in a bypass mode of the typical amplifying device, and G32 is a plot of an output return loss in a bypass mode of the amplifying device according to an example in the present disclosure.

With reference to the input return loss based on G21 and G22 of FIG. 12 and the output return loss based on G31 and G32 of FIG. 12, it may be seen that each of the return losses is enhanced by about 1 to 3 dB compared with the typical amplification devices in a use frequency band (Band=3.8 to 4.4 GHz).

The first capacitor C40 included in the filter 410 of the bypass circuit 400 shown in FIG. 7 may be used to enhance isolation in an amplification mode in which the bypass circuit 400 is in an off-state. However, an insertion loss may occur due to the ground of the first capacitor C40 in a bypass mode in which the bypass circuit 400 is in on-state.

Figure 13:
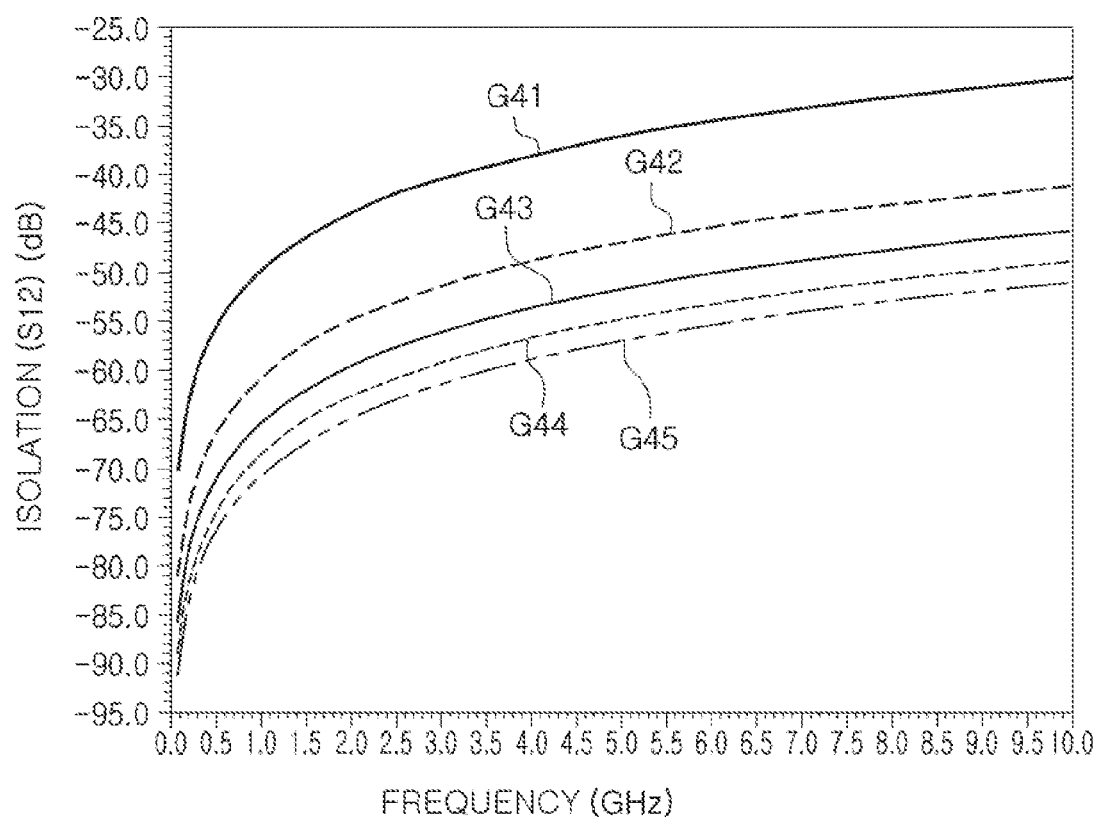
FIG. 13 is a diagram showing an example of isolation characteristics of a bypass circuit in an amplification mode of an amplifying device according to an example.
Figure 14:
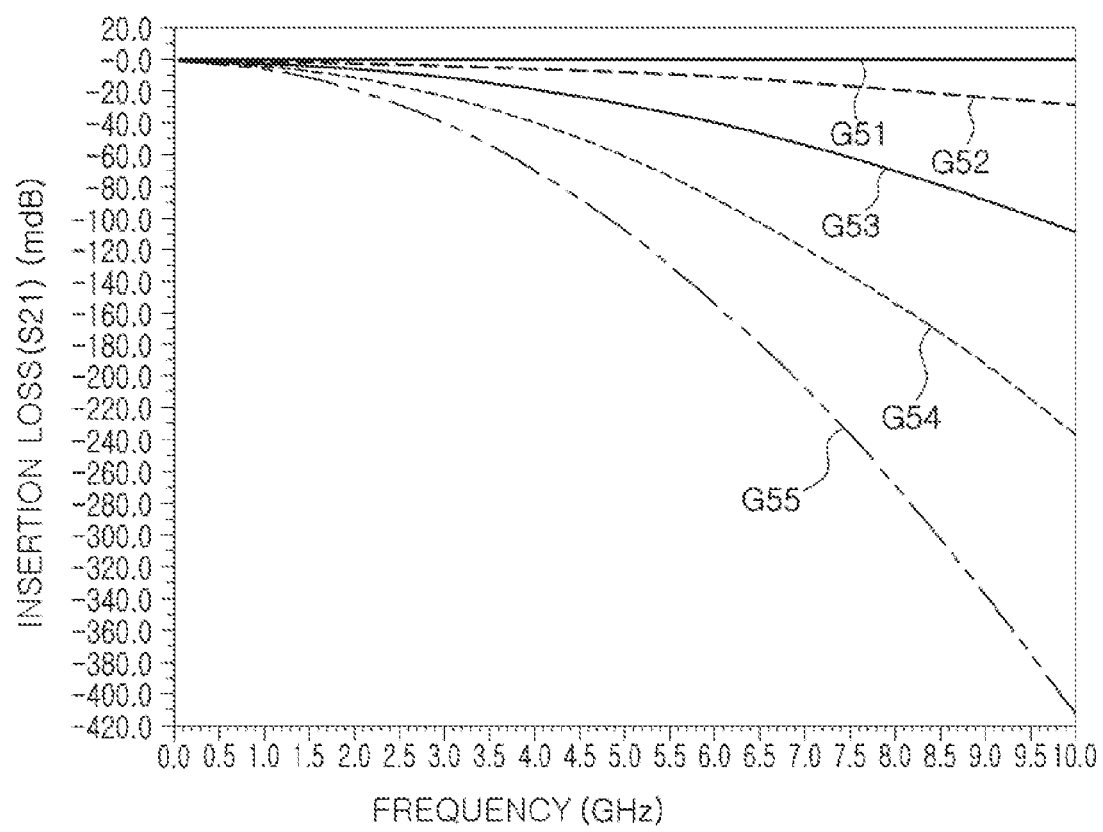
FIG. 14 is a diagram showing an example of insertion loss characteristics of a bypass circuit in a bypass mode of an amplifying device.

FIG. 13 is a diagram showing an example of isolation characteristics of a bypass circuit in an amplification mode of an amplifying device according to an example. FIG. 14 is a diagram showing an example of insertion loss characteristics of a bypass circuit in a bypass mode of an amplifying device according to an example.

FIGS. 13 and 14 are diagrams illustrating an example of a simulation result of isolation and insertion loss characteristics of the bypass circuit 400 according to the present disclosure.

In FIG. 13, G41 is a plot of isolation characteristics when a capacitance value of the first capacitor C40 is 0, G42 is a plot of isolation characteristics when a capacitance value of the first capacitor C40 is 50 femto-farad (fF), G43 is a plot of isolation characteristics when a capacitance value of the first capacitor C40 is 100 femto-farad (fF), G44 is a plot of isolation characteristics when a capacitance value of the first capacitor C40 is 150 femto-farad (fF), and G45 is a plot of isolation characteristics when a capacitance value of the first capacitor C40 is 200 femto-farad (fF).

As seen from graphs G41 to G45 of FIG. 13, as a capacitance value of the first capacitor C40 is increased, isolation is increased. However, as a capacitance value of the first capacitor C40 is increased, an effect of enhancing isolation converges. This result is achieved because, as a capacitance value of the first capacitor C40 is increased, the amount of a signal bypassed to ground at a corresponding frequency is increased. That is, as a capacitance value of the first capacitor C40 is increased, performance is enhanced in terms of isolation.

Then, in FIG. 14, G51 is a plot of insertion loss characteristics when a capacitance value of the first capacitor C40 is 0, G52 is a plot of insertion loss characteristics when a capacitance value of the first capacitor C40 is 50 femto-farad (fF), G53 is a plot of insertion loss characteristics when a capacitance value of the first capacitor C40 is 100 femto-farad (fF), G54 is a plot of insertion loss characteristics when a capacitance value of the first capacitor C40 is 150 femto-farad (fF), and G55 is a plot of insertion loss characteristics when a capacitance value of the first capacitor C40 is 200 femto-farad (fF).

As seen from G51 to G55 of FIG. 14, as a capacitance value of the first capacitor C40 is increased, an insertion loss is increased. This result is achieved because an insertion loss of a frequency of 3 dB is inversely proportional to a capacitance value (f3 dB=$1/(2*pi*R*C)$).

A capacitance value of the first capacitor C40 should be increased in terms of isolation in an amplification mode, but a capacitance value of the first capacitor C40 should be reduced in terms of an insertion loss in a bypass mode. As a result, the capacitance value of the first capacitor C40 should be set as a compromise in terms of both isolation and an insertion loss.

For example, as seen from FIGS. 13 and 14, when a capacitance value of the first capacitor C40 is set to 50 femto-farad (fF) (refer to G41 of FIG. 13 and G51 of FIG. 14), an insertion loss in a bypass mode in 4 GHz to 6 GHz is degraded by about 0.02 dB, but isolation in an amplification mode is enhanced by 10 dB. As such, the insertion and the isolation have a trade-off relationship, but the isolation may be enhanced rather than affecting the insertion loss in appropriate consideration of a frequency of 3 dB that affects the insertion loss. Referring to FIGS. 13 and 14, according to each example in the present disclosure, when a capacitance value of the first capacitor C40 is appropriately set depending on a frequency, at which the capacitance value is to be used, in consideration of isolation and an insertion loss, a signal loss of the bypass circuit 400 may be increased within an allowable range, and simultaneously, an effect of isolation in an amplification mode may be maximized. That is, the insertion loss and the isolation have a trade-off relationship, but may be designed to enhance isolation characteristics.

As set forth above, according to various examples, isolation characteristics via a bypass path may be enhanced, thereby ensuring the reliability and competitiveness of products.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplifying device comprising:
   an amplifying circuit connected between an input terminal and an output terminal, and configured to amplify a signal input in an amplification mode;
   an input matching circuit connected between the input terminal and the amplifying circuit, and configured to perform impedance matching between the input terminal and the amplifying circuit; and
   a bypass circuit comprising a filter connected to a bypass path of the bypass circuit for bypassing the amplifying circuit,
   wherein the bypass path is configured to operate in an off-state in the amplification mode, and is configured to operate in an on-state in a bypass mode, and the filter is configured to bypass an input high-frequency signal to ground, in the amplification mode,
   the filter comprises a capacitor connected between a ground and a connection node on the bypass path, a first resistor connected to the capacitor at the connection node, and a second resistor connected to the capacitor at the connection node, and
   the input matching circuit comprises:
   an input inductor connected between the input terminal and a first connection node and configured to perform impedance matching between the input terminal and the amplifying circuit; and
   a variable attenuation circuit connected to the input inductor in series and configured to adjust a signal damping ratio in conjunction with an amplification ratio of the amplifying circuit.

2. The amplifying device of claim 1, wherein the filter comprises a low pass filter configured to bypass the input high-frequency signal to ground, in the amplification mode.

3. The amplifying device of claim 1, wherein the bypass circuit comprises at least one of a first switch connected between the first connection node on an input side of the amplifying circuit and the filter, and a second switch connected between a second connection node on an output side of the amplifying circuit and the filter.

4. The amplifying device of claim 1, wherein the second resistor is connected on a second side of the connection node that connects the bypass path and the first capacitor.

5. The amplifying device of claim 3, further comprising:
an output matching circuit connected between the second connection node and the output terminal, and configured to perform impedance matching between the amplifying circuit and the output terminal, and further configured to adjust an amplifying gain and a return loss of the amplifying circuit.

6. An amplifying device comprising:
an amplifying circuit connected between an input terminal and an output terminal, and configured to amplify a signal input in an amplification mode;
an input matching circuit connected between the input terminal and the amplifying circuit and configured to perform impedance matching between the input terminal and the amplifying circuit;
an output matching circuit connected between the amplifying circuit and the output terminal and configured to perform impedance matching between the amplifying circuit and the output terminal;
a bypass circuit comprising a bypass path to bypass the amplifying circuit, wherein the bypass path is configured to operate in an off-state in the amplification mode, and is configured to operate in an on-state in a bypass mode, and an input high-frequency signal is bypassed to ground, in the amplification mode, and
a filter comprising a capacitor connected between a ground and a connection node on the bypass path, a first resistor connected to the capacitor at the connection node, and a second resistor connected to the capacitor at the connection node,
wherein the input matching circuit comprises:
an input inductor connected between the input terminal and a first connection node, and configured to perform impedance matching between the input terminal and the amplifying circuit; and
a variable attenuation circuit connected to the input inductor in series, and configured to adjust a signal damping ratio in conjunction with an amplification ratio of the amplifying circuit.

7. The amplifying device of claim 6, wherein:
the bypass circuit comprises the filter which is connected to the bypass path for bypassing the amplifying circuit; and
the filter comprises a low pass filter configured to bypass the input high-frequency signal to ground, in the amplification mode.

8. The amplifying device of claim 7, wherein the bypass circuit comprises at least one of a first switch connected between a first connection node on an input side of the amplifying circuit and the filter, and a second switch connected between a second connection node on an output side of the amplifying circuit and the filter.

9. The amplifying device of claim 7, wherein the second resistor is connected on a second side of the connection node that connects the bypass path and the capacitor.

10. The amplifying device of claim 8, wherein the output matching circuit comprises:
an output inductor connected between a terminal of a power voltage and the second connection node at the output side of the amplifying circuit;
a variable resistor circuit connected in parallel with the output inductor;
a variable capacitor circuit connected between the second connection node and the output terminal; and
an output capacitor connected between the output terminal and ground.

11. An amplifying device comprising:
an amplifying circuit connected between an input matching circuit and an output matching circuit, the amplifying circuit configured to amplify a high-frequency signal input in an amplification mode;
a bypass circuit connected between the input matching circuit and the output matching circuit, the bypass circuit configured to bypass the amplifying circuit in a bypass mode, and bypass the input high-frequency signal to ground in the amplification mode; and
a input matching circuit is configured to perform impedance matching between an input terminal and the amplifying circuit,
wherein the bypass circuit includes a filter comprising a capacitor connected between a ground and a connection node on a bypass path of the bypass circuit, a first resistor connected to the capacitor at the connection node, and a second resistor connected to the capacitor at the connection node, and
the input matching circuit comprises:
an input inductor connected between the input terminal and a first connection node and configured to perform impedance matching between the input terminal and the amplifying circuit; and
a variable attenuation circuit connected to the input inductor in series and configured to adjust a signal damping ratio in conjunction with an amplification ratio of the amplifying circuit.

12. The amplifying device of claim 11, wherein the output matching circuit is configured to perform impedance matching between the amplifying circuit and an output terminal.

* * * * *